March 19, 1968 G. LUECKE 3,374,404

SURFACE-ORIENTED SEMICONDUCTOR DIODE

Filed Sept. 18, 1964

United States Patent Office 3,374,404

Patented Mar. 19, 1968

3,374,404

SURFACE-ORIENTED SEMICONDUCTOR DIODE

Gerald Luecke, Richardson, Tex., assignor to Texas Instruments Incorporated, Dallas, Tex., a corporation of Delaware Filed Sept. 18, 1964, Ser. No. 397,479
13 Claims. (Cl. 317—234)

ABSTRACT OF THE DISCLOSURE

A surface-oriented device as a diode having anode and cathode regions formed at one surface of a high resistivity or intrinsic semiconductor substrate is included as one element of a mixer useful for microwave applications. Conductive striplines make ohmic contact with the anode and cathode regions and a ground plane is located on the back surface of the substrate.

This invention relates to semiconductor diodes and more particularly relates to a surface-oriented diode structure.

In integrated semiconductor circuits the resistors, capacitors, and inductances, along with the active elements, are formed in and on semiconductor bodies. Such networks operable at very high frequencies permit construction in which strip line conductors are formed on the surface of high resistivity material or are formed on or insulated from semiconductive materials which would otherwise introduce substantial losses. In either such case, integrated circuits have been found to be, in accordance with the present invention, enchanced in their utility by the inclusion of a new and unique diode structure.

More particularly in accordance with the invention, a semiconductive apparatus is provided which includes a semiconductive wafer having opposed major faces with the bulk of the wafer being substantially intrinsic. A pair of spaced-apart zones of opposite conductivity type are formed in one major face of the wafer. A pair of conductive strips extend over the surface of the wafer into electrical contact with the exposed surfaces of the respective zones. The junctions between the respective zones and the intrinsic semiconductive material are disposed at confronting locations where the junctions emerge from the wafer to form a diode. The junctions may be spaced apart to form a PIN diode, or may be contiguous to form a PN diode.

In a further aspect, a major face of the wafer includes a continuous layer of high resistivity material with the resistivity of the bulk of the wafer exceeding about 50 ohm-centimeters.

For a more complete understanding of the present invention and for further objects and advantages thereof, reference may now be had to the following description taken in conjunction with the accompanying drawings in which.

Figures 1, 2, 3, 4:
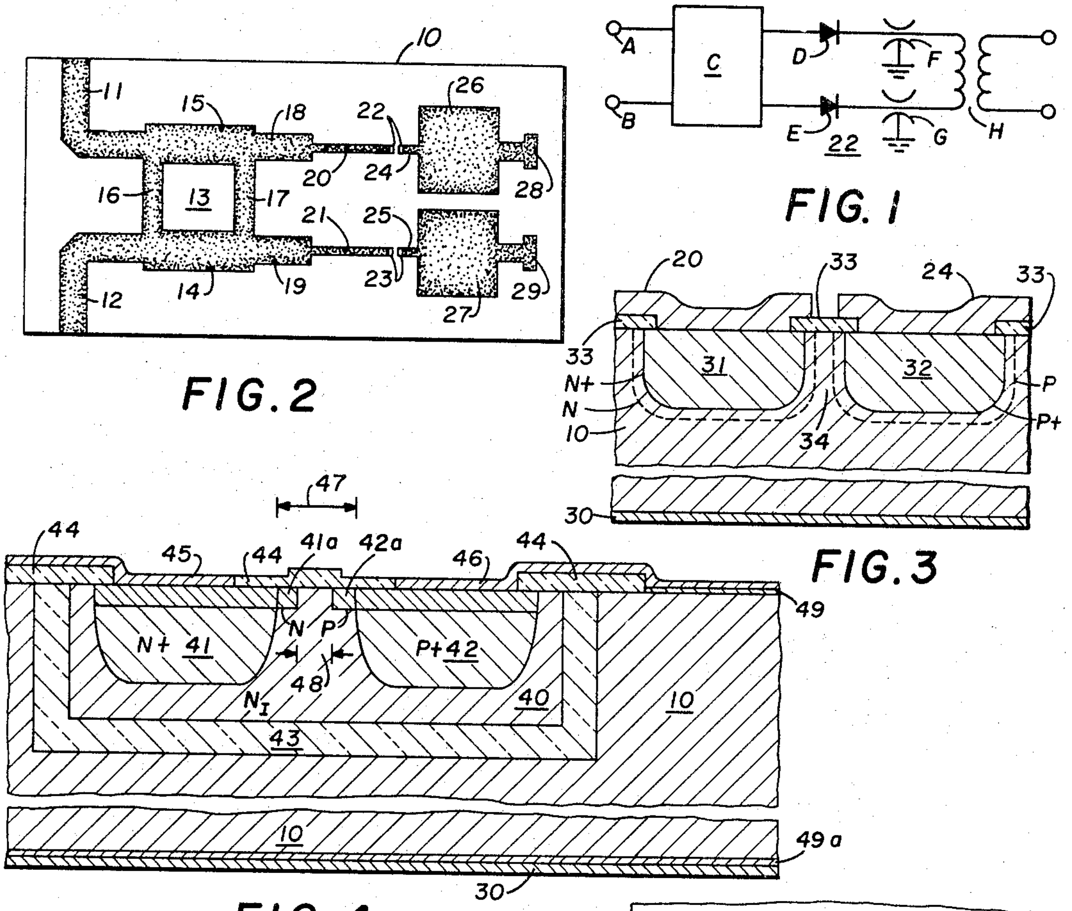
FIGURE 1 is a lumped constant circuit diagram of a balanced mixer requiring a pair of diodes.
FIGURE 2 is a top view of a semiconductor wafer on which an integrated circuit corresponding to the mixer of FIGURE 1 is formed.
FIGURE 3 is a sectional view of one embodiment of a surface-oriented diode of FIGURE 2.
FIGURE 4 is a sectional view of a further embodiment of the diode.

Referring now to FIGURE 1, a mixer circuit involves a signal input terminal A and a local oscillator input terminal B leading to coupler C. Output lines from coupler C extend to diodes D and E, respectively, with shunt capacitances F and G leading to ground. An output transformer H provides a path for an output signal from the mixer which may be one of the modulation products from the mixer.

The present invention involves the construction of a diode particularly suitable for use as the diodes D and E in an integrated semiconductor circuit embodiment such as represented by the mixer of FIGURE 1.

A mixer converts the received signal to a lower frequency preferably with a minimum of added noise. To optimize the noise level for the receiver, both the signal-to-noise ratio of the mixer and the conversion loss in the mixer must be as low as possible. A detected microwave signal and a local oscillator output signal are applied to a semiconductor junction and the difference, as an IF output signal, is extracted. Mixers employing diodes constructed in accordance with the present invention and illustrated in FIGURES 2–5 may be employed for operation at frequencies in the X-band. Operation thereof is characterized by low loss, employing high ratio couplers of integrated circuit form.

More particularly, as shown in FIGURE 2, a semiconductor wafer 10 is provided with a signal input strip 11 and a local oscillator input strip 12. Strips 11 and 12 are metalized regions overlaying a high-resistivity semiconductor wafer. The metalized regions 11 and 12 lead to the input portions of a hybrid coupler 13. The coupler 13 is provided with parallel sections 14 and 15 which are about one-quarter wavelength long and are of a width substantially greater than the width of the strips 11 and 12. Two shunt strips 16 and 17 are spaced approximately one-quarter wavelength apart and extend between sections 14 and 15. Output lines 18 and 19 extend from the coupler 13.

A pair of a quater-wave transformer sections 20 and 21 extend from the output strips 18 and 19, respectively, and make contact with terminals of surface-oriented diodes 22 and 23, respectively. Output conductors 24 and 25 lead from the other terminals of diodes 22 and 23 to output capacitors 26 and 27 to provide an output signal at output terminals 28 and 29.

With strip-line transmission lines overlaying the semiconductor wafer 10 and with surface-oriented diodes of a construction hereinafter described, a signal in the X-band may be converted to IF with about a 5 db loss. For example, a 9 gc. signal may be applied to strip 11. A local oscillator signal at 8.5 gc. may be applied to the input strip 12. As a result, an IF signal of 500 mc. is produced at terminals 28 and 29.

The surface-oriented diode 22 is illustrated in one form in FIGURE 3. The wafer 10, of intrinsic silicon, is provided with a ground plane conductive layer 30. The intrinsic silicon forms a high-resistivity zone above the ground plane layer 30. An N-type alloyed region 31 and a P-type alloyed region 32 are formed in the surface of the wafer 10 opposite the ground plane layer 30. A silicon dioxide insulating layer 33 is formed over the upper surface of wafer 10 to cover the surface emergence of the junctions forming the boundaries between the P-type and N-type alloyed sections and the intrinsic wafer 10. An N-type metal alloy strip 20 is then formed on the surface of the wafer 10 so as to make electrical contact with the N-type region 31. A P-type metal alloy strip 24 is formed on the surface to make electrical contact with the region 32. The P-type and N-type metal alloy strips 20 and 24 are evaporated onto the surface through holes in oxide masks defined by photolithographic techniques. The metal alloy strips are then alloyed into the silicon to produce the N+ and P+ regions between the strips and the N-type and P-type regions 31 and 32. An intrinsic region 34 is disposed between the N and P regions, the boundary junctions of which are shown in dotted outline.

Such fabrication of the surface-oriented mixer diode is in a form compatible with the integrated circuit construction. The diode is a substantial improvement over conventional microwave mixer elements. Previous mixer diodes have been of the point contact variety in order to maintain low junction capacitance. The present construction has achieved junction capacitances of 0.05 picofarads (pf.) or less. When biased by rectification of the local oscillator signal to obtain the best noise figure, the shunt resistance of the junction of the present invention is approximately 400 ohms. In ordinary mixer diode configuration, this value of resistance is transformed to an input impedance of about 50 to 100 ohms by the package inductance and the junction capacitance. In the present case, the junction diameter of the diode is approximately 0.1 mil (0.0001 inch). Production of a semi-conductor junction of this size, as above noted, employs intrinsic silicon having side-by-side alloy zones to form confronting edge junctions that will give the surface diode effect.

The material required for the integrated circuit preferably will provide a suitable substrate for microwave strip transmission lines and for forming the mixer semiconductor junctions. Intrinsic silicon and high-resistivity gallium arsenide may be employed for mixer diodes, whereas germanium has characteristics which are not suitable for both the microwave strip transmission line and the diode construction. Where extremely low loss transmission lines are required, low loss dielectrics with deposited silver conductors are employed. Yttrium-iron-garnet (yig) substrates may also be employed for this purpose.

FIGURE 4 illustrates a modified form of surface-oriented diode wherein side-by-side diffusions of opposite-conductivity type impurities are formed on the upper surface of an intrinsic silicon wafer 40. The N-type diffused zone **41*a* and the P-type diffused zone 42*a* are characterized by an edge junction that will give the surface diode effect. The zones 41*a* and 42*a* are formed partially in N+ and P+ diffusion zones 41 and 42, respectively, which in turn are formed in an insulated island of intrinsic silicon about 1 mil wide and 5 mils long formed in the wafer by an insulating layer 43** of silicon dioxide.

The spacing between the edges of the diffused N+ and P+ zones 41 and 42 is about 0.3 mil in zone 47. However, the zone 48 between the confronting junctions of the N and P zones **41*a* and 42*a* is about 0.1 mil wide. The capacitance of the junction is defined by the effective junction area of the shallow diffusions and the reverse breakdown by the shallow diffused spacing and the intrinsic or I-layer concentration. Conductivity modulation under forward current conditions is minimized by reason of the effective increase injection area of the anode of the deep P+ diffusion. The problem is in defining the I-layer between the diffusion fronts so that a sufficient current density can be obtained at reasonable current levels. For currents of 20 milliamps, about a 4 square mil area will give a current density of 200 amps per square centimeter required for conductivity modulation. An insulating layer 44 covers the surface of the wafer except for metalized contact zones 45 and 46**.

Surface-oriented diodes of the type illustrated in FIGURES 3 and 4 may be employed in the mixer of FIGURE 2. Where additional current-carrying capacity is required of surface-oriented diodes, as in the transmit-receive switches employed in various systems, the construction such as shown in FIGURE 5 may be employed.

Figures 5, 6:
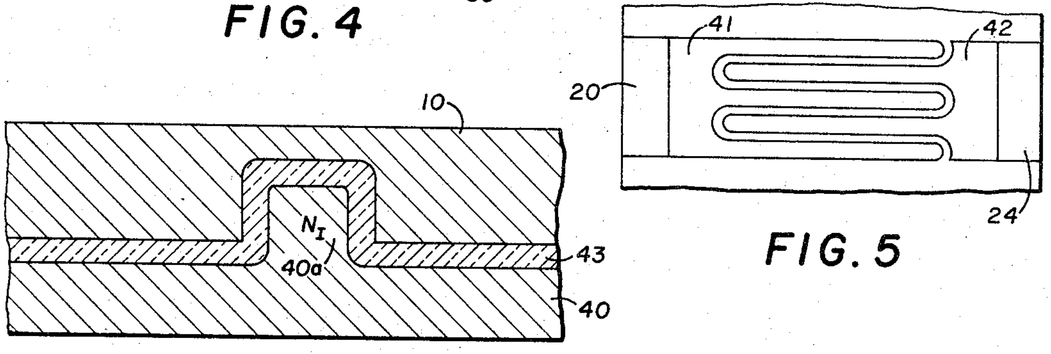
FIGURE 5 illustrates an interdigitated surface-oriented diode.
FIGURE 6 illustrates preliminary steps in forming the diode of FIGURE 4.

In FIGURE 5, the transmission lines 20 and 24 are shown contacting the diffused zones 41 and 42, respectively. The diffused zone 41 has three fingers. The zone 42 has two fingers with the fingers being enmeshed or interdigitated to provide a junction of high current-carrying capability. Such a construction exhibits low junction capacitance under moderate reversed-bias conditions and low loss.

Intrinsic silicon as the substrate material for the diodes provides insulation isolation for any number of components deposited upon it and also provides a low loss structure. The structure is readily adaptable to receiving strip transmission lines deposited directly onto the silicon. In accordance with one mode of fabrication, a ground plane conductor is evaporated onto the bottom of an intrinsic silicon substrate of approximately 5 mils thickness. Silicon dioxide on the top is etched to expose the silicon where transmission lines are required. Gold is then evaporated over the entire surface and selectively removed to leave gold over the exposed regions of the silicon. Preferably, in order to maintain the propagation properties of the lines, the alloying of gold with silicon will be avoided, as by the forming of a thin layer, a few microns thick, of a material such as molybdenum between the gold strips and the silicon.

As an alternative mode of fabrication, a hot substrate evaporation of gold onto the intrinsic silicon is carried out. The gold is then etched away to leave the transmission lines where required. At microwave frequencies, the degradation of leakage current due to the introduction of the gold into the silicon is of little consequence. In the same manner, aluminum strip transmission lines may be formed on gallium arsenide to form the transmission line pattern on a given substrate. Thus, the mixer of FIGURE 2 is a flat, integrated circuit package. The integrated circuit may be part of more complex circuits formed on the same or interconnected substrates.

Figure 7:
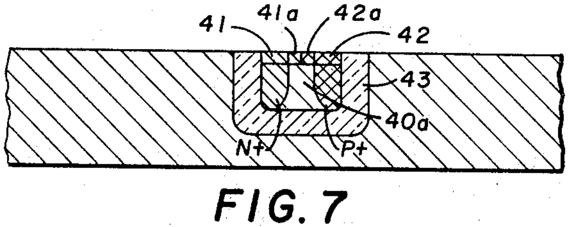
FIGURE 7 illustrates further processing steps in forming the diode of FIGURE 4.
Figure 8:
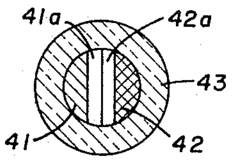
FIGURE 8 is a top view of the diode of FIGURE 7.

Referring again to FIGURE 4, a diffused, surface-oriented diode with insulation isolation represents a preferred embodiment of the invention. One procedure for forming this structure is shown in FIGURES 6–8. The structure illustrated in FIGURES 6–8 is similar to the structure illustrated in FIGURE 4, and corresponding parts will therefore be designated by corresponding reference numerals. However, the structure of FIGURES 6–8 is illustrated as round while the structure of FIGURE 4 is rectangular. The surface of a single crystal, high-resistivity substrate of N-type material is etched on the surface to form a mesa **40*a* on the top surface. The oxide layer 43 is then grown over the upper surface of the etched wafer and over the mesa 40*a* to form an insulating layer over the entire etched surface. The material forming the bulk substrate 10 of the structure in FIGURE 4 is then deposited or grown over the top of the slice 40 to completely cover the insulation layer 43 and to surround the insulation covered mesa. After the bulk material 10 is grown onto the top of the wafer, the top (in FIGURE 6) of the bulk material 10 is lapped smooth for receiving the ground plane conducting layer 30** shown in FIGURE 4.

The substrate 40 is then lapped so that all of the original wafer is removed except for the mesa which is then the island **40*a* located in a well or depression surrounded by the isolation layer of silicon oxide 43 as shown in FIGURE 7. Thereafter as shown in FIGURE 8, through a photomasking technique, N+ and P+ diffusions are made to form the zones 41 and 42 of opposite-conductivity types in the island 40*a*. Inside the island there is then high enough impurity concentration for good low resistivity ohmic contact. The low resistivity (high concentration) diffusions have a very narrow intrinsic zone between them, of the order of 0.3 mil wide. Into this area of original material, there are made two very shallow diffusions 41*a* and 42*a* of N and P-type materials, respectively. The diffusions are very shallow (3 lines or 3×0.016 mil) with high concentrations. The junction between the N and P shallow diffusion zones 41***a* and 42*a* is not or need not be accurately positioned as long as it is within the 0.3 mil strip. The junction between the two zones is 1 mil wide and 3 lines deep or an area of 1×3×0.016 mil=0.048 sq. mil. This results in a very low capacitance junction suitable for use in the mixer of FIGURE 1. Contacts 45 and 46 are readily applied to the two N+ and P+ regions of FIGURES 7 and 8 to be used for bonding or pressure contacts alloyed in.

Where the diode is to be employed in the mixer application, the separation 48, FIGURE 4, between the junctions will be reduced to zero. The boundaries of the two zones will thus be contiguous. Surface-oriented diodes for use in switching applications will be constructed with separation between the two zones and for high current capability, will be interdigitated as shown in FIGURE 5.

In FIGURE 4, the transmission lines 45 and 46 extend along the top of the insulating layer 44 from contact with the zones 41 and 42. Preferably, the transmission line leading to and from the surface-oriented diode, except for the insulation over the junctions as shown in FIGURE 4, will be formed directly on the surface of the semiconductor material 10. Preferably, ground plane conductor 30 and the low resistance conductive strips 45 and 46 are gold and overlay an extremely thin film of a metal such as molybdenum, as above noted, or of vanadium, platinum, nickel or tungsten evaporated to a thickness of a few microns to form an underlayer for each strip. The underlayer having a high eutectic temperature will prevent the formation of lossy zones that would otherwise be present were gold strips to be formed directly onto the silicon surface and then subjected to treatment at temperatures wherein the silicon would become intermixed with the gold at the boundary thereof. Such zones are avoided by the use of the thin fiilm 49. The ground plane layer 30 is shown as having been formed over a film 49*a* on the bottom surface of the structure as shown in FIGURE 4 where the film 49*a* would be of materials the same as film 49.

The mixer unit shown in FIGURE 1 is described and claimed in copending application Ser. No. 397,480, filed Sept. 18, 1964, of Tom Hyltin and Philip Thomas.

Thus, in accordance with the invention there is provided a high-frequency diode structure in a semiconductor wafer. A pair of zones in the wafer of opposite-conductivity types each have boundaries outside the other and have junctions thereof emerging to the top surface at closely adjacent points. A pair of strip-line conductors on the top of the wafer extend into contact with the zones.

For switching use, the junctions are spaced apart to form a PIN diode junction. For mixer use, the confronting portions of the junctions are contiguous or overlap to form a PN diode junction. In the latter case, the boundary of the last diffused zone would define the diode junction.

Having described the invention in connection with certain specific embodiments thereof, it is to be understood that further modifications may now suggest themselves to those skilled in the art and it is intended to cover such modifications as fall within the scope of the appended claims.

What is claimed is:

1. A surface oriented semiconductor diode structure comprising:

(a) a high resistivity semiconductor substrate, (b) a pair of zones of opposite conductivity type in said substrate defined by junctions between each of said zones and the substrate, said junctions emerging solely at one surface of the substrate and having adjacent portions which are separated by a narrow zone of high resistivity material of said substrate, said zones and said narrow zone forming a PIN diode, (c) a pair of metallic strip line conductors at said one surface respectively ohmically connected to each of said zones, and (d) a substantially continuous metallic film on the opposite surface of said substrate providing a ground plane, said film being separated from said pair of zones by the bulk of said high resistivity substrate.

2. A high frequency diode structure which comprises:

(a) a substrate, (b) a high-resistivity, single crystal semiconductor wafer disposed in a recess in the substrate and isolated from the substrate by a first insulating layer, the wafer and the insulating layer emerging at the surface of the wafer with the insulating layer around the wafer, (c) a pair of zones in said wafer of opposite conductivity types defined by junctions between each of said zones and the wafer which emerge at the surface of the wafer at adjacent positions to form a diode, each of the said pair of zones being comprised of a relatively deep high impurity diffused region having a relatively low resistance and a relatively shallow, low impurity concentration diffused region having a relatively high resistance, a portion of each of the low impurity concentration regions being common with the high impurity concentration region to provide good electrical contact, and the two high impurity concentration regions being spaced apart a greater distance than the low impurity concentration regions so that adjacent edges of the low impurity concentration regions will form the said diode, (d) a second layer of insulating material over the surface of the wafer and the emergence of the first insulating layer, and (e) a pair of strip-line conductors extending over the surface of the substrate and the second insulation layer and through openings in the second insulation layer into contact with the high impurity concentration regions of the respective zones.

3. A semiconductor device which comprises:

(a) a high resistivity semiconductor wafer;

(b) a pair of zones in said wafer of opposite conductivity types defined by junctions between each of said zones and the wafer which emerge at the surface of the wafer at adjacent positions to form a diode, each of the said pair of zones being comprised of a relatively deep, high impurity concentration diffused region having a relatively low resistance and a relatively shallow, low impurity concentration diffused region having a relatively high resistance, a portion of each of the low impurity concentration regions being common with the high impurity concentration region to provide good electrical contact, and the two high impurity concentration regions being spaced apart a greater distance than the low impurity concentration regions so that the adjacent edges of the low impurity concentration regions will form the said diode, and (c) a pair of strip-line conductors on the surface of said wafer, each conductor extending into contact with a high impurity concentration diffused region of one of said pair of zones.

4. The combination set forth in claim 3 in which the edges of the low impurity concentration regions are spaced apart to form a PIN diode junction.

5. The combination set forth in claim 3 in which the edges of the low impurity concentration regions are contiguous to form a PN diode junction.

6. A surface oriented semiconductor diode structure comprising:

(a) a high resistivity semiconductor substrate, (b) a pair of zones of opposite conductivity type in said substrate defined by junctions between each of said zones and the substrate, said junctions emerging solely at one surface of the substrate and having adjacent portions which are separated by a narrow zone of high resistivity material of said substrate, each of said pair of zones having a relatively low impurity concentration region and a relatively high impurity concentration region, the low impurity concentration regions and said narrow zone forming a PIN diode, and (c) a pair of metallic conductors at said one surface respectively ohmically connected to each of said relatively high impurity concentration regions.

7. The combination set forth in claim 6 in which said junctions are interdigitated.

8. The combination set forth in claim 6 in which said pair of zones are diffused zones.

9. The combination set forth in claim 6 in which said substrate is an island located in a second substrate and electrically isolated from said second substrate by an insulation layer.

10. The combination set forth in claim 6 in which an insulating layer is deposited on the said one surface and covers the surface emergence of the junctions defining the said pair of zones, and the pair of strip line conductors extend through openings in the said insulating layer.

11. The combination set forth in claim 10 in which the insulating layer is an oxide.

12. The combination set forth in claim 6 in which the substrate is intrinsic silicon.

13. The combination set forth in claim 6 in which the substrate is high-resistivity gallium arsenide.

References Cited

UNITED STATES PATENTS

| | | | |
|---|---|---|---|
| 2,816,847 | 12/1957 | Shockley | 317—235 X |
| 2,908,871 | 10/1959 | McKay | 317—235 X |
| 2,981,877 | 4/1961 | Noyce | 317—235 |
| 3,008,089 | 11/1961 | Uhlire | 317—235 X |
| 3,244,949 | 4/1966 | Hilbiber | 317—235 |
| 3,249,764 | 5/1966 | Holonyak | 307—88.5 |
| 3,307,984 | 3/1967 | Frazier | 317—235 |

OTHER REFERENCES

Electronic News; pg. 42; Apr. 20, 1964.

Electronic Review; pg. 23; vol. 37, No. 17; June 1, 1964.

JOHN W. HUCKERT, *Primary Examiner.*

A. M. LESNIAK, *Assistant Examiner.*